United States Patent [19]
Durand

[11] Patent Number: 5,053,714
[45] Date of Patent: Oct. 1, 1991

[54] MEASURING CIRCUIT OF THE ADDITIVE PHASE NOISE CHARACTERISTIC OF A COMPONENT IN THE VICINITY OF A CARRIER FREQUENCY

[75] Inventor: Jacques Durand, Villebon S/Yvette, France

[73] Assignee: Thomson-CSF, Puteaux, France

[21] Appl. No.: 525,737

[22] Filed: May 21, 1990

[30] Foreign Application Priority Data

May 19, 1989 [FR] France ............................... 89 06586

[51] Int. Cl.[5] ........................................... G01R 27/00
[52] U.S. Cl. .................................. 324/613; 324/77 G; 324/83 R; 324/83 A; 324/614; 364/728.03
[58] Field of Search ................ 455/63, 226, 229, 304, 455/310; 324/613, 614, 605, 77 G, 83 R, 83 A; 364/572, 574, 819, 724.12, 728.03, 728.01

[56] References Cited

U.S. PATENT DOCUMENTS

| | | | |
|---|---|---|---|
| 3,961,172 | 6/1976 | Mutcheon | 455/304 |
| 4,118,665 | 10/1978 | Reinhardt | 324/613 |
| 4,581,767 | 4/1986 | Monsen | 324/613 |

FOREIGN PATENT DOCUMENTS

2451584 10/1980 France .

OTHER PUBLICATIONS

Proceedings of the 41st Annual Frequency Symposium 1987, IEEE Catalog No. 87 CH2427-3, Library of Congress No. 58-60781, Dunfey City Line Hotel, Philadelphia, Pennsylvania, U.S., pp. 507-511; D. E. Philips: "Random noise in digital gates and dividers" *FIG. 5*.
I.S.A. Transactions, vol. 21, 1982, No. 4, pp. 37-44; A. L. Lance et al: "Phase noise measurement systems" *FIGS. 2,4,6*.
IEEE Transactions on Macrowave Theory and Techniques, vol. MTT-16, No. 9, Sep. 1968, pp. 761-766; K. H. Sann: "The measurement of near-carrier noise in microwave amplifiers" *FIGS. 1,3*.

Primary Examiner—Kenneth A. Wieder
Assistant Examiner—Jose M. Jolis
Attorney, Agent, or Firm—Oblon, Spivak, McClelland, Maier & Neustadt

[57] ABSTRACT

A measuring circuit for the additive phase noise characteristic of a component in the vicinity of a carrier frequency. The measuring circuit is constructed of a central channel and two side channels. Each of these channels contains a model of the component to be characterized. Two phase detecting circuits are employed in which each processes an input signal from one of the side channels with an input signal from the central channel to generate signals which represent phase deviations between the two input signals. An intercorrelation circuit then utilizes the outputs from these phase detecting circuits to determine the characteristic additive phase noise of the component to be characterized by eliminating any additive phase noise superadded by other measuring circuit elements or induced by outside disturbances.

18 Claims, 2 Drawing Sheets

MEASURING CIRCUIT OF THE ADDITIVE PHASE NOISE CHARACTERISTIC OF A COMPONENT IN THE VICINITY OF A CARRIER FREQUENCY

BACKGROUND OF THE INVENTION

1. Field of the Invention

This invention relates to a measuring circuit for the additive phase noise characteristic of a component in the vicinity of a carrier frequency.

2. Discussion of the Background

An additive phase noise (in contrast to a source phase noise) is the phase noise or jitter added by a given component of a circuit.

Presently, it is known to measure the additive phase noise produced by a frequency divider, which typically is a component for which the phase noise is a critical characteristic. The metrological engineering used so far for this purpose consists in producing, by a single generator, a predetermined frequency which feeds jointly and in quadrature two identical channels which each comprise a model of the component to be characterized. The signals obtained downstream from these components in each of the channels are applied to respective inputs of a mixer combining these two signals and delivering at the output a function signal of the instantaneous phase deviations between the two channels; the signal at the output of the mixer, which then is detected and amplified, thus gives an indication of the additive phase noise of the component to be characterized, the source phase noise of the generator, which is identical on the two channels, being eliminated by the mixture.

The limits of this method, which is based on the principle of the single phase detection, stem from the fact that at the output of the mixer there is generated not only a signal representative of the additive phase noise introduced by the component to be characterized but also of an additive noise superadded by the mixer (and its associated detection and amplification circuits) and by that of outside disturbances.

Now, concerning the mixer, it is very difficult to quantify its characteristic additive phase noise, which is not constant and varies in particular as a function of the signal levels applied to its inputs.

Further, concerning the outside disturbances, measuring circuits produced on the above-mentioned principle are extremely sensitive to radiation and vibrations, because the area in which it is sought to characterize the phase noise is located in a narrow frequency band around a given central frequency (designated as the "carrier frequency" here), typically in a range of 0.1 to 10 kHz around this carrier frequency. To compensate for those low frequency signals corresponding to high amplitude man-made noise signals induced by the environment, in particular radiations and vibrations (which induce the noise in the circuit by microphonic effect), it is necessary to provide extremely elaborate nonvibrating assemblies and shields and to perform the characterization of the component in a metrological environment with a low level of outside disturbances. This considerably increases the cost of the apparatus and limits its possibilities of use.

Thus, in practice, these components can not be accurately characterized in terms of phase noise, as the characteristic phase noise of the component is combined with the superadded phase noise of the mixer and the outside disturbances, and it then is very difficult to extract the signal that is desired to be measured from these mixed interferences.

SUMMARY OF THE INVENTION

Accordingly, one object of the present invention is to eliminate all the above-mentioned drawbacks by proposing a measuring circuit of the additive phase noise of a component which exhibits a very slight lower limit of noise.

Accordingly, another object of the present invention is to develop a measuring circuit which by its structure, will make it possible to eliminate the influence both of outside disturbances and additive phase noises inherent in other components of the circuit and thus will obtain measurement dynamics notably greater than that of the known measuring circuits.

The invention advantageously makes possible the measurement of the phase noise produced by a frequency divider, which typically is a component for which the phase noise is a critical characteristic. This application has no limiting nature, however, and the invention can make possible as well the measurement of the performances of any component generating a phase noise of additive nature (frequency multiplier, amplifier, active filter, etc.).

For this purpose, the measuring circuit of the invention comprises a central channel and two side channels, each of which contains a model of the component to be characterized. The measuring circuit also employs a signal source generating a signal at the carrier frequency, this source being a common source which identically feeds the central channel and the side channels. Then, the measuring circuit dephases in quadrature the signals of the side channels relative to that of the central channel. Two phase detecting circuits, each combining the signal of the central channel with the signal of the respective one of the side channels then deliver at an output a function signal of the instantaneous phase deviations between the signals applied at its input. The measuring circuit then intercorrelates the respective output signals from these two detecting circuits, the result of this intercorrelation making it possible to determine the characteristic of the additive phase noise of the component to be characterized, extracted from the additive phase noises superadded by other elements of the circuit and by induced outside disturbances.

According to a certain number of advantageous characteristics or preferred embodiments, the dephasing in quadrature of the signal of the side channels relative to that of the central channel will utilize two adjustable phase shifters in quadrature each placed in one of the side channels in series with the component. In this case, if the component to be characterized is a component with a frequency change, the adjustable phase shifter in quadrature placed in series with the latter is preferably on the side of the highest frequencies.

A rejector or band pass filter may be further provided in each of the side channels or in the central channel. The filter being centered about the carrier frequency and whose band width is adjusted to assure, at the output of the phase detecting circuits, the rejection of noise interspectra products attached to the composite lines produced by the component.

Each of the side channels and/or the central channel may also comprise a variable attenuator making it possible to adjust the relative levels of the signals applied at the input of the phase detecting circuits. Each of the phase detecting circuits may also comprise a mixer and an amplifying and integrating circuit at the output of this mixer.

Further, the measuring circuit invention provides for establishing the Fourier transform from the result of the intercorrelation, to determine the spectral density of phase noise power of the component to be characterized.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
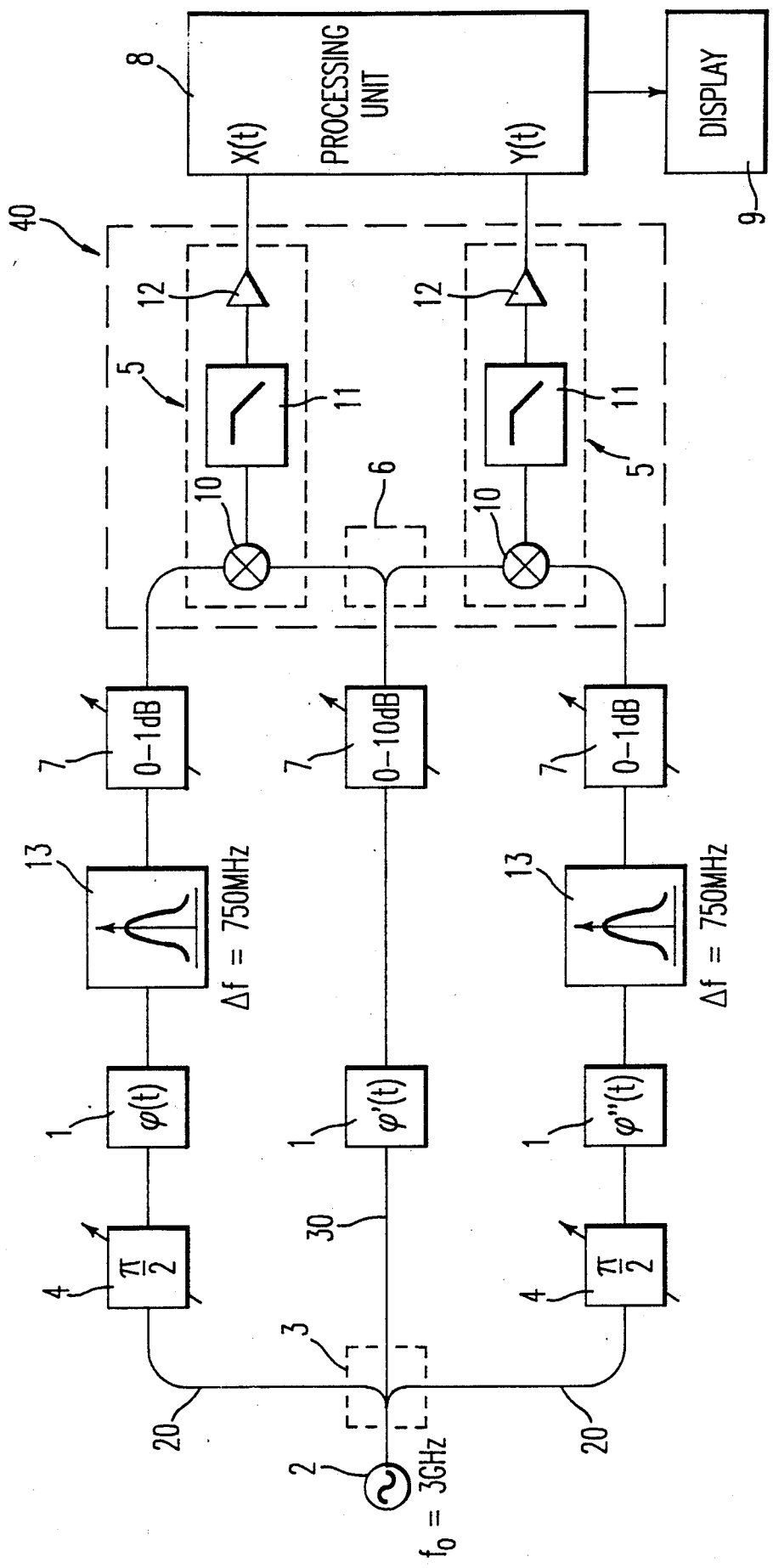
FIG. 1 is a diagrammatic representation by blocks of the measuring circuit of the invention.

Referring now to the drawings, wherein like reference numerals designate identical or corresponding parts throughout the several views, and more particularly to FIG. 1 thereof, in which reference 1 designates the component which is to have its additive phase noise characterized, of which three models (assumed identical) are placed in three channels fed jointly by a signal source 2 at a carrier frequency (for example, a source at frequency $f_o=3$ GHz, around which it is desired to characterize the component). The source signal is delivered to the three channels, two side channels 20 and a central channel 30, through a power divider or power splitter 3, to make possible a synchronized dynamic operation of the three channels at the desired carrier frequency.

Each side channel 20 comprises $\pi/2$ adjustable phase shifter 4 making it possible to dephase by a quarter period the signal of each of the side channels 20 relative to that of the central channel 30 (as a variant, only a single phase shifter placed in the central channel 30 also could be used, but in this case, it would not be possible to adjust separately the exact quadrature of each of the side channels 20).

It will be noted incidentally that, when component 1 to be characterized is a component with frequency change, phase shifter 4 preferably is placed on the side of the highest frequencies, which makes it possible to use a line of smaller dimension; thus, if component 1 is a frequency divider, phase shifter 4 will be placed upstream from the component, and, conversely, if component 1 is a frequency multiplier, phase shifter 4 will be placed downstream from this multiplier.

The signals at the outputs of each of the side channels 20 are combined with the signal at the output of the central channel 30 in a phase detecting circuit 40 receiving on its inputs the corresponding signals, the signal of the central channel 30 being distributed identically on two phase detectors 5 by a two channel power divider 6. Attenuators 7, placed at the output of the various side channels, make it possible to adjust the input levels to phase detectors 5 to have exactly the same levels on the two inputs of each of the mixers; this makes it possible to assure the precise adjustment of the quadrature by zero detection at the outputs of circuit 40.

Respective outputs X(t) and Y(t) of phase detectors 5 are applied to an acquisition and processing unit 8 (for example a microcomputer driven at the input by an analog/digital converter) which digitizes (for example on 12 bits), samples and records the data for a sufficient observation time so that the operations performed on these various samples provide a significant result (in the sense of the rules of the digital processing of the signal); the results obtained will then be displayed on a display device 9.

Concerning phase detecting circuits 5, each of them comprises a mixer 10, which is a balanced dual mixer with standard type diodes, compatable in power with the signals used (the characteristic noise of this mixer, in contrast to engineering of the prior art is un... ...nt 'n the selection of the mixer because, as wi.. later, this characteristic noise will be elimi.. -- hv the processing executed in unit 8).

At the output of mixer 10, a signal representative of the phase deviations between the signal of the central channel and that of the corresponding side channel is obtained in the form of a continuous voltage proportional to this phase deviation, to which the additive noise of the elements of the circuit (essentially that of component 1 to be characterized and that of mixer 10) is superadded. If the levels are suitably adjusted by attenuators 7, the continuous voltage at the output of the mixer will be zero (exact quadrature), and the only signal delivered therefore will be the phase noise signal.

This phase noise signal, which is of a very low level (typically, on the order of several microvolts on an impedance of 50Ω) is amplified and integrated by a unit comprising a lowpass filter 11 and an amplifier 12, thus giving at the output a signal X(t) or Y(t) compatible in level (several volts) and in impedance (high impedance) with the analog/digital converter of acquisition unit 8. Low-pass filter 11 assures the rejection of the mixture components of an order greater than that of the carrier frequency $f_o$.

Advantageously, a filter 13, centered about the carrier frequency and whose selectivity is chosen to reduce the nonlinearity effects due to the interspectra products after mixing, is further provided on each of the side channels 20. Actually, some components 1 to be characterized (such as frequency dividers in particular) generate, as an output, harmonics, of relatively high levels, of the signal at the carrier frequency which is applied to them as an input; the harmonic lines thus produced are affected, of course, by the same phase noise as the main line, in which there is interest.

Now, as mixers 10 act as frequency multipliers, they will give products from all the parasitic lines and therefore on all the interspectra connected to these parasitic lines and, in the absence of special precautions, the noise characteristic given by the measuring circuit would take into account this anomaly, which would proportionately degrade the lower limit of overall noise of the measuring circuit.

For this reason, filter 13 is provided which makes it possible, at the output of the component to be characterized, to eliminate all the parasitic line signals generated by component 1, while keeping only the main line corresponding to basic carrier frequency $f_o$. In the particular case where component 1 is a frequency divider by 4 and a carrier frequency of 3 GHz is used, a filter thus can be used which allows to pass only a band width of 750 MHz around the carrier frequency.

It will be noted that it is not necessary to provide such a filter in the central channel. Actually, the role of this filter is to eliminate the interspectra products, and it is sufficient to eliminate the parasitic lines from one of the two factors of this product to achieve the desired result.

It is preferable that filter 13 be a passive filter, to not introduce an additional characteristic additive phase noise which would then create an additional disturbance.

The processing of the signal performed by acquisition and processing unit 8 will now be described.

It will be assumed that the additive phase noise introduced by the component to be characterized is a noise signal without a basic feature, i.e. that, concerning the nature of the noise sources, it verifies the standard hypotheses of stationary state, independence and Gaussian spectra distribution.

If it is assumed that are exact quadrature has been achieved, signals X(t) and Yt) of the following form (the phase fluctuations being verl slight, $\phi$ is assimilated to sine $\phi$) are obtained:

$$X(t) = K_x[\phi'(t) - \phi(t)] + b_x(t), \text{ and},$$

$$Y(t) = K_y[\phi'(t) - \phi''(t)] + b_y(t),$$

$\phi(t)$, $\phi'(t)$ and $\phi''(t)$ being the additive phase noises (random variables) introduced by components 1 of the first side channel, the central channel and the second side channel, respectively;

$K_x$ and $K_y$ being the constants connected to the gain of mixer 10 and amplifying/integrating circuit 11, 12; and $b_x(t)$ and $b_y(t)$ being the additive phase noises (also random variables) of the detecting elements (mixer and amplifier) of each channel.

In the prior art, characteristic phase noises $b_x(t)$ and $b_y(t)$ constituted an annoyance which, according to this present invention, will be able to be eliminated, which thus will result in an increase of the measuring dynamics of the system.

The manner will be shown in which, in acquisition and processing unit 8, the spectral density of phase noise power attached to component 1 inserted in the central channel can be extracted by intercorrelation of these two signals X(t) and Y(t).

Actually, if an intercorrelation function $R_{xy}$ of the two signals X(t) and Y(t) is expressed according to the algebra of expected values, $$R_{xy}(\tau) = E\{X(t)Y(t-\tau)\},$$

or $$R_{xy}(\tau) = K_x K_y E\{\phi'(t) - \phi'(t-\tau)\}.$$

where
$\tau$ = delay between the signals
E = mathematical expression of expected values x(t) and y(t−τ) is obtained.

Taking into account the hypothesis made earlier of independence of the associated events in the other terms of the operation, and if $K_x = K_y = K$, K being a known value (the mixers and their associated circuits being calibrated), $$R_{xy}(\tau) = K^2 C[\phi'(t)],$$

where C is a correlation function between x(t) and y(t), i.e., to within a factor, the autocorrelation function of random variable $\phi'(t)$, is obtained. The Fourier transform of this autocorrelation function (time range) gives the spectral density (frequency range) of phase noise power, which is the characteristic generally sought.

In other words, everything which, on the outside channels, is correlated (very particularly, the additive phase noise superadded by mixer 10) disappears, and as a result of the processing, the autocorrelation of the additive phase noise introduced in the channel of &.he medium, i.e., the additive phase noise of single component 1, is obtained.

Thus, a significant increase of the dynamics relative to the systems of the prior art is obtained; the theoretical gain that thus can be obtained is on the order of 20 dB, and it is found that a simple measuring circuit, made without special precaution concerning the protection from radiation and vibrations already obtains a gain greater than 6 dB relative to a measuring circuit of the prior art which is very protected from radiation and vibrations, and which is therefore of a notably higher cost.

Figure 2:
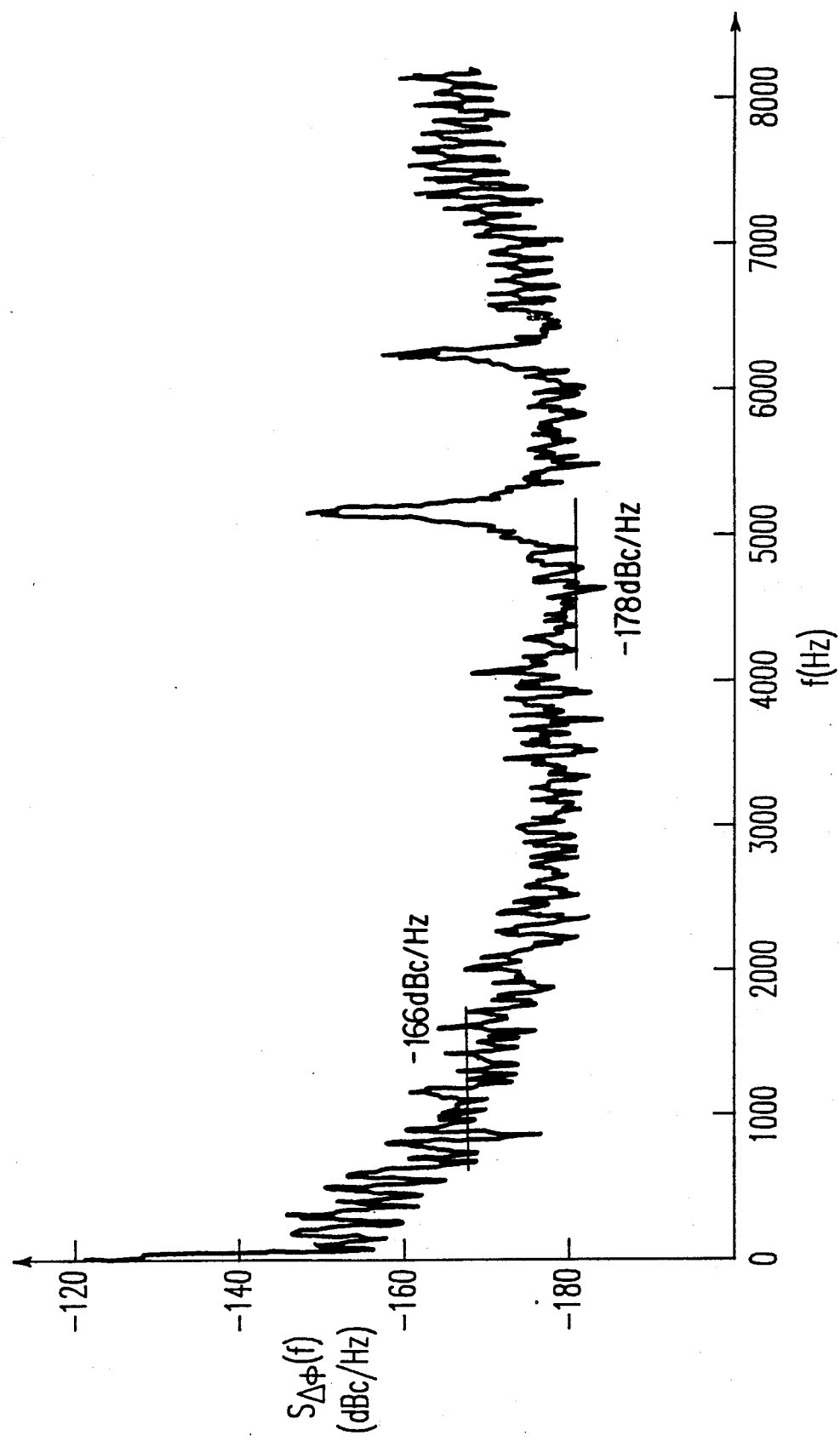
FIG. 2 illustrates a characteristic, noted on the circuit of FIG. 1, giving the spectral density of the lower limit noise as a function of the deviation relative to the carrier frequency.

FIG. 2 illustrates the lower limit of noise of the system (i.e., the noise obtained by short-circuiting the components to be characterized), given by spectral density $S\Delta\phi(f)$ as a function of frequency deviation f relative to the carrier frequency (here, a frequency of 3 GHz). It is seen that a minimum lower limit of noise on the order of—178 dBc/Hx—value lower than the heat noise—and a nominal lower limit of noise at 1000 Hz of—166 dBc/Hz are obtained.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A measuring circuit for measuring the additive phase noise characteristic of a component to be characterized in the vicinity of a carrier frequency, comprising:
   a central channel and two side channels, each channel comprising a model of said component to be characterized;
   a signal source for generating a source signal at said carrier frequency, said signal source being a common source identically feeding the central channel and the two side channels with said source signal;
   means to dephase in quadrature the signals of the side channels relative to that of the central channel;
   two phase detecting circuits, each combining an input signal of the central channel with an input signal of a respective one of the side channels to deliver at an output a function signal (X(t); Y(t)) of the instantaneous phase deviations (l'(t)−l(t); l'(t)−- l''(t)) between the input signals; and
   means to intercorrelate the respective output signals of these two detecting circuits, the result of this intercorrelation making it possible to determine the characteristic of the characteristic additive phase noise of the component to be characterized, extracted from superadded additive phase noises of other elements of the circuit and from induced outside disturbances.

2. The measuring circuit of claim 1, wherein the means to dephase in quadrature the signal of the side channels relative to that of the central channel comprises:
two adjustable phase shifters in quadrature each placed on one of the side channels in series with the component to be characterized.

3. The measuring circuit of claim 2, wherein the component to be characterized is a component with a frequency change and an adjustable phase shifter in quadrature is placed in series with the component to be characterized on the side of the highest frequencies.

4. The measuring circuit of claim 1, further comprising:
in each of the side channels a band pass filter, centered on the carrier frequency and width is adjusted to assure, at the output of the phase detecting circuits, rejection of noise interspectra products attached to composite lines produced by the component to be characterized.

5. The measuring circuit of claim 1, wherein each of the side channels comprises:
a variable attenuator making it possible to adjust relative levels of the signals applied at the input of the phase detecting circuits.

6. The measuring circuit of claim 1, in which each phase detecting circuit comprises:
a mixer;
an integrating circuit at the output of the mixer;
an amplifying circuit.

7. The measuring circuit of claim 1, further comprising:
means to establish the Fourier transform from the result of the intercorrelation, to determine the spectral density of phase noise power of the component to be characterized.

8. The measuring circuit of claim 1, further comprising:
in the central channel a band pass filter, centered on the carrier frequency and whose band width is adjusted to assure, at the output of the phase detecting circuits, rejection of noise interspectra products attached to composite lines produced by the component to be characterized.

9. The measuring circuit of claim 1, wherein the central channel comprises:
a variable attenuator making it possible to adjust relative levels of the signals applied at the input of the phase detecting circuits.

10. A measuring circuit for measuring the additive phase noise characteristic of a component to be characterized in the vicinity of a carrier frequency, comprising:
a central channel and two side channels, each channel comprising a model of said component to be characterized;
a signal source for generating and supplying a source signal at said carrier frequency to each of said channels;
means to dephase in quadrature the signals of the side channels relative to that of the central channel;
two phase detecting circuits, each combining an input signal of the central channel with an input signal of a respective one of the side channels to deliver at an output a function signal of the instantaneous phase deviations between the input signals; and
means to intercorrelate the respective output signals of these two detecting circuits, thereby making it possible to determine of the characteristic additive phase noise of the component to be characterized, extracted from superadded additive phase noises of other elements of the circuit and from induced outside disturbances.

11. The measuring circuit of claim 10, wherein the means to dephase in quadrature the signal of the side channels relative to that of the central channel comprises:
two adjustable phase shifters in quadrature each placed on one of the side channels in series with the component to be characterized.

12. The measuring circuit of claim 11, wherein the component to be characterized is a component with a frequency change and an adjustable phase shifter in quadrature is placed in series with the component to be characterized on the side of the highest frequencies.

13. The measuring circuit of claim 10, further comprising: in each of the side channels a band pass filter, centered on the carrier frequency and whose band width is adjusted to assure, at the output of the phase detecting circuits, rejection of noise interspectra products attached to composite lines produced by the component to be characterized.

14. The measuring circuit of claim 10, wherein each of the side channels comprises:
a variable attenuator making it possible to adjust relative levels of the signals applied at the input of the phase detecting circuits.

15. The measuring circuit of claim 10, in which each phase detecting circuit comprises:
a mixer;
an integrating circuit at the output of the mixer;
an amplifying circuit.

16. The measuring circuit of claim 10, further comprising:
means to establish the Fourier transform from the result of the intercorrelation, to determine the spectral density of phase noise power of the component to be characterized.

17. The measuring circuit of claim 10, further comprising:
in the central channel a band pass filter, centered on the carrier frequency and whose band width is adjusted to assure, at the output of the phase detecting circuits, rejection of noise interspectra products attached to composite lines produced by the component to be characterized.

18. The measuring circuit of claim 10, wherein the central channel comprises:
a variable attenuator making it possible to adjust relative levels of the signals applied at the input of the phase detecting circuits.

* * * * *